US011245978B2

(12) United States Patent
Zhang

(10) Patent No.: US 11,245,978 B2
(45) Date of Patent: Feb. 8, 2022

(54) LOUDSPEAKER

(71) Applicant: AAC Technologies Pte. Ltd., Singapore (SG)

(72) Inventor: Guqing Zhang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/994,652

(22) Filed: Aug. 16, 2020

(65) Prior Publication Data
US 2020/0413184 A1 Dec. 31, 2020

Related U.S. Application Data

(63) Continuation of application No. PCT/CN2019/093735, filed on Jun. 28, 2019.

(51) Int. Cl.
H04R 1/28 (2006.01)
H05K 1/18 (2006.01)
H04R 9/06 (2006.01)
H04R 9/02 (2006.01)

(52) U.S. Cl.
CPC ........... *H04R 1/2834* (2013.01); *H04R 9/025* (2013.01); *H04R 9/06* (2013.01); *H05K 1/189* (2013.01)

(58) Field of Classification Search
CPC .................................. H04R 1/288; H04R 1/00
See application file for complete search history.

(56) References Cited

U.S. PATENT DOCUMENTS

| 9,900,704 | B2* | 2/2018 | Ma | H04R 9/06 |
| 10,277,986 | B2* | 4/2019 | Li | H04R 9/043 |
| 10,932,051 | B2* | 2/2021 | Chen | H04R 9/06 |
| 2011/0051987 | A1* | 3/2011 | Ueda | H04M 19/04 |
| | | | | 381/412 |
| 2012/0170783 | A1* | 7/2012 | Zha | H04R 9/025 |
| | | | | 381/332 |
| 2014/0056447 | A1* | 2/2014 | Li | H04R 1/00 |
| | | | | 381/162 |
| 2020/0213715 | A1* | 7/2020 | Cao | H04R 9/06 |
| 2020/0213753 | A1* | 7/2020 | Cao | H04R 9/025 |
| 2020/0213762 | A1* | 7/2020 | Zhang | H04R 9/06 |

* cited by examiner

Primary Examiner — Angelica M McKinney
(74) Attorney, Agent, or Firm — W&G Law Group

(57) ABSTRACT

The present invention provides a loudspeaker, which includes a frame, and a vibration system and a magnetic circuit system, the vibration system includes a membrane and a voice coil, the vibration system further includes a yoke, and a main magnet assembly and a side magnet assembly, the side magnet assembly is spaced apart from the main magnet assembly to form a magnetic gap, and an end of the voice coil away from the membrane is suspended in the magnetic gap. The side magnet assembly includes a side magnet, and a first pole plate, the first pole plate is spaced apart from the membrane to form a spacing communicated with the magnetic gap, the loudspeaker further includes a leakage channel, one end of the leakage channel is communicated with the spacing, and another end of the leakage channel is communicated with an outside of the loudspeaker.

18 Claims, 8 Drawing Sheets

LOUDSPEAKER

FIELD OF THE PRESENT DISCLOSURE

The present disclosure relates to an acoustoelectric field, and more particularly to a loudspeaker.

DESCRIPTION OF RELATED ART

Loudspeaker is a transducer that converts electrical signals into acoustic signals. It is widely used in various audio devices and mobile terminal devices, and mobile phones are undoubtedly the most common mobile terminal devices. At present, mobile phones have various functions, one of which is to play high-quality music, and one of the prerequisites for this is the loudspeaker.

Loudspeaker generally includes a magnetic circuit system, a vibration system, and a frame. The vibration system has a membrane, and the membrane pushes and presses air to generate sound when vibrating. However, when the membrane of the existing loudspeaker vibrates downwards, the airflow below the membrane may be blocked by the magnetic circuit system and the frame, which results in a poor air flow, thus generating noise and affecting the hearing sense.

SUMMARY

An objective of the present disclosure is to provide a loudspeaker, aiming at avoiding a bad hearing sense caused by an unsmooth airflow under the membrane when the vibration system of the loudspeaker vibrates.

In order to realize the above objective, the present disclosure provides a loudspeaker, which includes a frame, and a vibration system and a magnetic circuit system both mounted to the frame, the vibration system includes a membrane fixed on the frame and a voice coil supported on a side of the membrane, the magnetic circuit system includes a yoke fixed on a side of the frame away from the membrane, and a main magnet assembly and a side magnet assembly both fixed on the yoke, the side magnet assembly is located at opposite sides of the main magnet assembly and is spaced apart from the main magnet assembly to form a magnetic gap, and an end of the voice coil away from the membrane is suspended in the magnetic gap, the side magnet assembly includes a side magnet fixed to the yoke, and a pole plate stacked on a side of the side magnet away from the yoke, the pole plate is spaced apart from the membrane to form a spacing communicated with the magnetic gap, the loudspeaker further includes a leakage channel extended from the pole plate to the frame and to an outside of the frame, one end of the leakage channel is communicated with the spacing, and the other end of the leakage channel is communicated with the outside of the loudspeaker.

As an improvement, the leakage channel includes a through hole formed in the pole plate and a through groove formed in the frame, the through hole is communicated with the slot, and the through groove is configured to communicate the through hole with the outside of the loudspeaker.

As an improvement, the pole plate includes two opposite first side plates respectively corresponding to the side magnet and two second side plates respectively connected between two ends of the first side plates; the frame includes an annular body and a support part extended from an end of the annular body away from the membrane to the voice coil and configured for supporting the pole plate; the through hole is defined in a side of the second side plate away from the voice coil; and the through groove is defined in a portion of the annular body corresponding to the through hole.

As an improvement, the through hole penetrates through the second side plate along a vibration direction of the voice coil, and the through groove penetrates through the annular body along a direction perpendicular to the vibration direction of the voice coil.

As an improvement, the first side plate includes a lug, the support part includes a notch corresponding to the lug, and a shape of the notch is matched with that of the lug.

As an improvement, each second side plate defines three through holes arranged at intervals.

As an improvement, the vibration system further includes a support member fixed on a side of the voice coil away from the membrane, one end of the support member is connected with the voice coil, and the other end of the support member is fixed with the frame, and the support member and the side magnet are located on different sides of the frame.

As an improvement, the yoke includes a main body for fixing the main magnet assembly and the side magnet, and a flange extended from the main body to the support member, and the support member includes a flexible circuit board fixed with the flange and a lower diaphragm sandwiched between the flexible circuit board and the frame; the lower diaphragm includes a first edge portion fixed with the voice coil, a second edge portion spaced from the first edge portion, and a suspension connected between the first edge portion and the second edge portion, the second edge portion is fixed with the frame, and the suspension has an arc-shaped structure extended away from the flexible circuit board.

As an improvement, the pole plate and the frame are integrated as one piece by injection molding, and the pole plate defines an injection positioning hole.

The present disclosure has the following advantage: the loudspeaker is provided with a leakage channel, one end of the leakage channel is communicated with the spacing, the other end of the leakage channel is communicated with the outside of the loudspeaker. Therefore, when the vibration system vibrates downwards, the air in the gap can be discharged through the leakage channel, keeping the air flowing, so that no noise is generated, and the hearing sense is improved.

DETAILED DESCRIPTION OF THE EXEMPLARY EMBODIMENT

Figure 1:
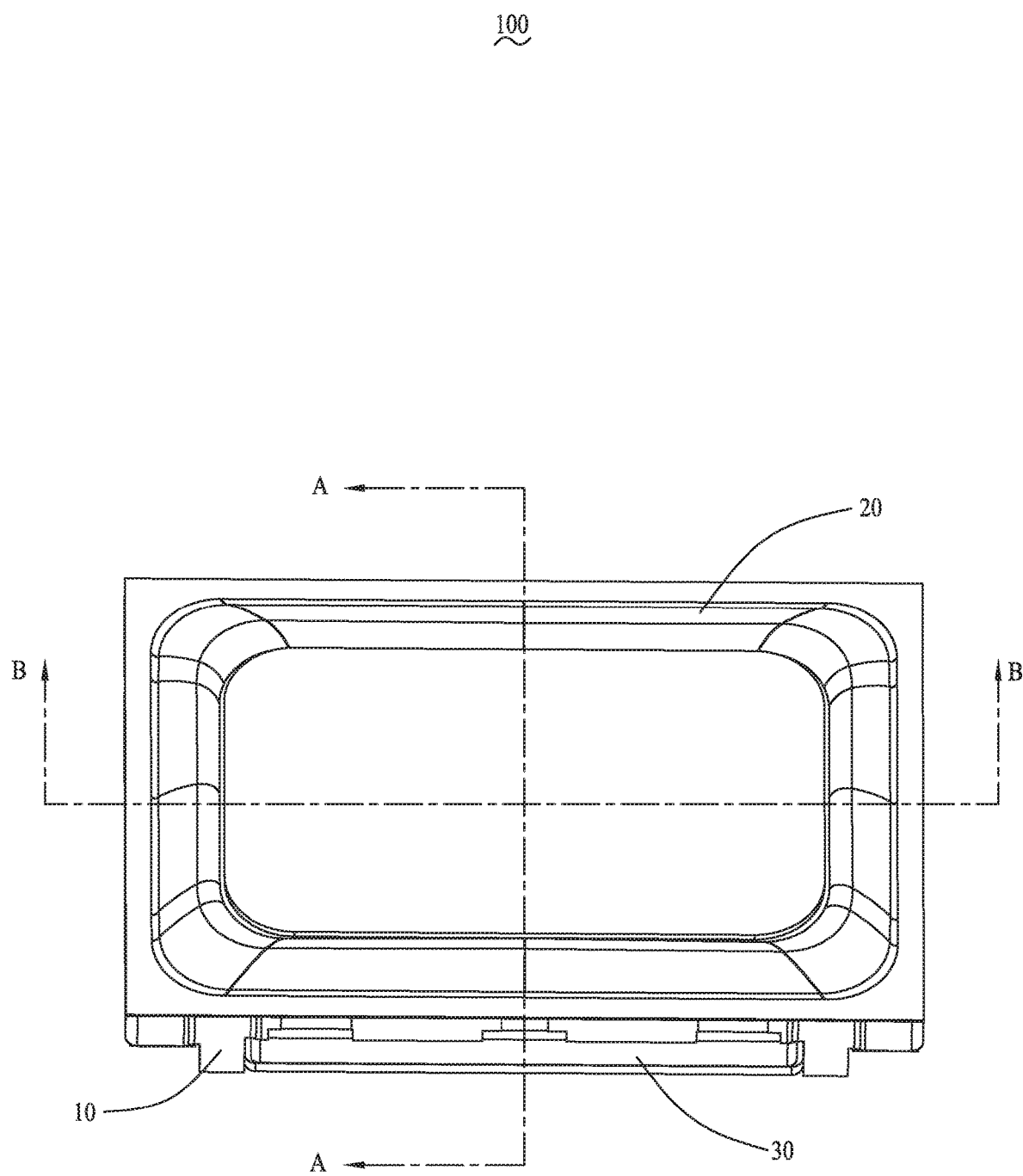
FIG. 1 is a schematic view of a loudspeaker of the present disclosure.
Figure 2:
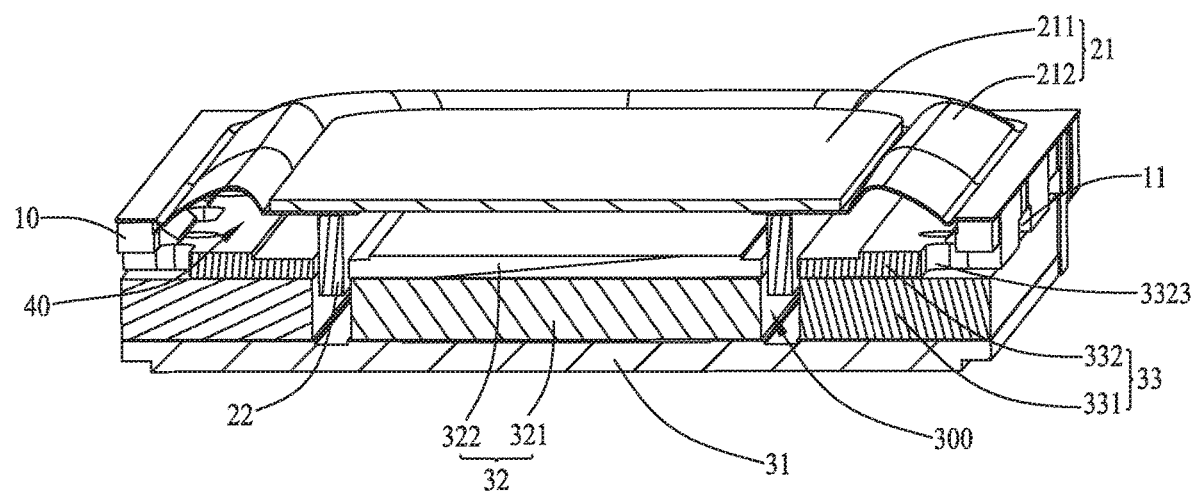
FIG. 2 is a cross sectional view along line A-A in FIG. 1.

The present disclosure will be described in detail with reference to FIGS. 1 to 8.

It should be noted that all directional indicators (such as up, down, left, right, front, back, inside, outside, top, bottom, etc.) in the embodiments of the present disclosure are only used to explain the relative positional relationships among components under a specific posture (as shown in the attached figures). If the specific posture changes, the directional indicators change accordingly.

It should also be noted that when an element is said to be "fixed" or "arranged" on another element, the element may be directly on the another element, or there may be a middle element between the two elements. When an element is said to be "connected" to another element, the element may be directly connected to the another element, or there may be a middle element between the two elements.

Referring to FIGS. 1 through 5, a loudspeaker 100 provided according to an embodiment of the present disclosure includes a frame 10, a vibration system 20, and a magnetic circuit system 30. The frame 10 is configured for supporting the vibration system 20 and the magnetic circuit system 30, the magnetic circuit system 30 is configured for driving the vibration system 20 to vibrate and generate sound, and a vibration direction of the vibration system 20 is an axial direction of the loudspeaker 100.

The vibration system 20 includes a membrane 21, a voice coil 22, and a support member 23. The support member 23 includes a lower diaphragm 24 and a flexible circuit board 25. The vibration system 20 is connected to the frame 10 through the membrane 21. The membrane 21 includes a dome 211 and an upper diaphragm 212. Two opposite sides of the upper diaphragm 212 are respectively connected with the frame 10 and the middle dome 211. An axial end of the voice coil 22 is connected with an end of the upper diaphragm 212 closing to the dome 211, the other axial end of the voice coil 22 is connected with the flexible circuit board through the lower diaphragm 24. When alternating current is introduced into the voice coil 22 through the flexible circuit board 25, the voice coil 22 vibrates under an action of the magnetic field of the magnetic circuit system 30, and drives the whole vibration system 20 to vibrate, making the membrane 21 push and press air to generate sound.

The magnetic circuit system 30 includes a yoke 31 fixed to the frame 10, and a main magnet assembly 32 and a side magnet assembly 33 both fixed to the yoke 31. The main magnet assembly 32 is spaced from the side magnet assembly 33 to form a magnetic gap 300. The main magnet assembly 32 includes a main magnet 321 and a second pole plate 322 fixed to a side of the main magnet 321 away from the yoke 31. The side magnet assembly 33 includes a side magnet 331 fixed to the yoke 31 and a first pole plate 332 fixed to the frame 10. A spacing 40 communicating with the magnetic gap 300 is formed between the first pole plate 332 and the membrane 21. The loudspeaker 100 has a leakage channel 50 extending from the first pole plate 332 to the frame 10 and further to the outside of the frame 10. One end of the leakage channel 50 is communicated with the spacing 40, and the other end of the leakage channel 50 is communicated with an outer side of the loudspeaker 100. One end of the lower diaphragm 24 is connected between the voice coil 22 and the flexible circuit board 25 along an axis direction of the loudspeaker 100, and the other end of the lower diaphragm 24 is located between the frame 10 and the flexible circuit board 25 along the axis direction of the loudspeaker 100. Preferably, the second first pole plate 332 and the first pole plate 322 are made of permeability magnetic material, and are configured to form a magnetic circuit with the main magnet 321 and the side magnet 331 to reduce the magnetic resistance.

Referring to FIGS. 5 through 8, the first pole plate 332 of the present disclosure is annular, and is formed by enclosing two opposite first side plates 3321 respectively corresponding to the side magnet 331 and two opposite second side plates 3322 which are connected between the two first side plates 3321. A through hole 3323 communicated with the spacing 40 is formed in a side, i.e., an outer edge, of each of two second side plates 3322 away from the voice coil 22. The frame 10 is provided with through grooves 11 which are configured to communicate the through holes 3323 with the outside of the loudspeaker 100 and have the same quantity as that of the through holes 3323. That is, there is a leakage channel 50 formed by the through hole 3323 together with the groove 11 at the junction of the first pole plate 332 and the frame 10. Therefore, when the membrane 21 vibrates downwards to squeeze air, the air in the spacing 40 may pass through the through holes 3323, then be discharged through the through grooves 11, keeping the air flowing, so that noise is avoided, and the hearing sense is improved. When the membrane 21 vibrates upwards, the outside air can flow into the loudspeaker 100 through the through grooves 11 and the through hole 3323, so that a pressure inside the loudspeaker 100 is the same as an outside pressure. Specifically, in the exemplary embodiment, each second side plate 3322 is provided with three through holes 3323 at intervals. Understandably, the quantity of the through holes 3323 is not limited to three. For example, the quantity of the through holes 3323 may be one, two, or some other number, etc. Optionally, the through holes 3323 are arranged along the axial direction of the loudspeaker 100. It would be understood that the through hole 3323 may also be arranged obliquely relative to the axial direction of the loudspeaker 100.

Referring to FIGS. 3, 5, 7 and 8, the frame 10 includes an annular body 12, a column foot 13 arranged at a bottom of the annular body 12, and a support part 14 extended from one end of the annular body 12 away from the membrane 21 towards the voice coil 22 and configured for supporting the first pole plate 332. The frame 10 and the first pole plate 332 are integrally formed by an injection molding. The first pole plate 332 has a plurality of injection positioning holes 3324. The annular body 12 has a plurality of positioning columns 121 corresponding to the injection positioning holes 324. The through grooves 11 are arranged in the annular body 12. The two first side plates 3321 of the first pole plate 332 are both provided with lugs 3325, and the support part 14 has notches 141 matched with shapes of the lugs 3325. Understandably, the frame 10 and the first pole plate 332 can also be assembled together.

Figure 3:
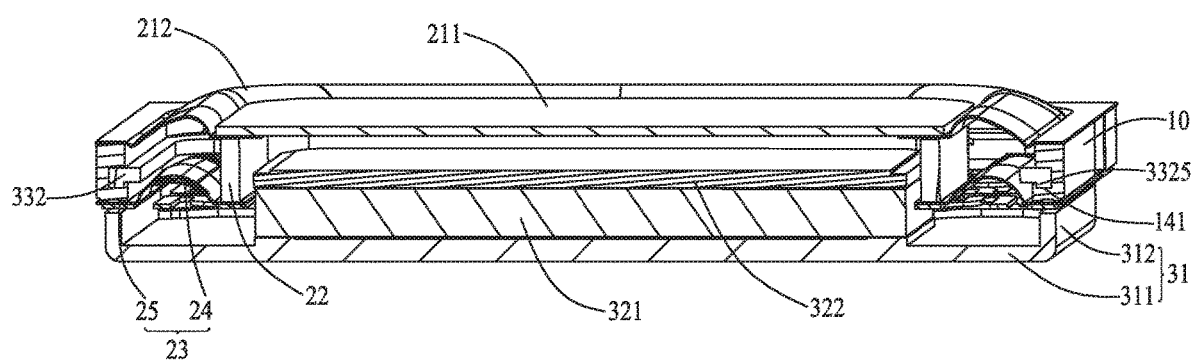
FIG. 3 is a cross sectional view along line B-B in FIG. 1.
Figure 4:
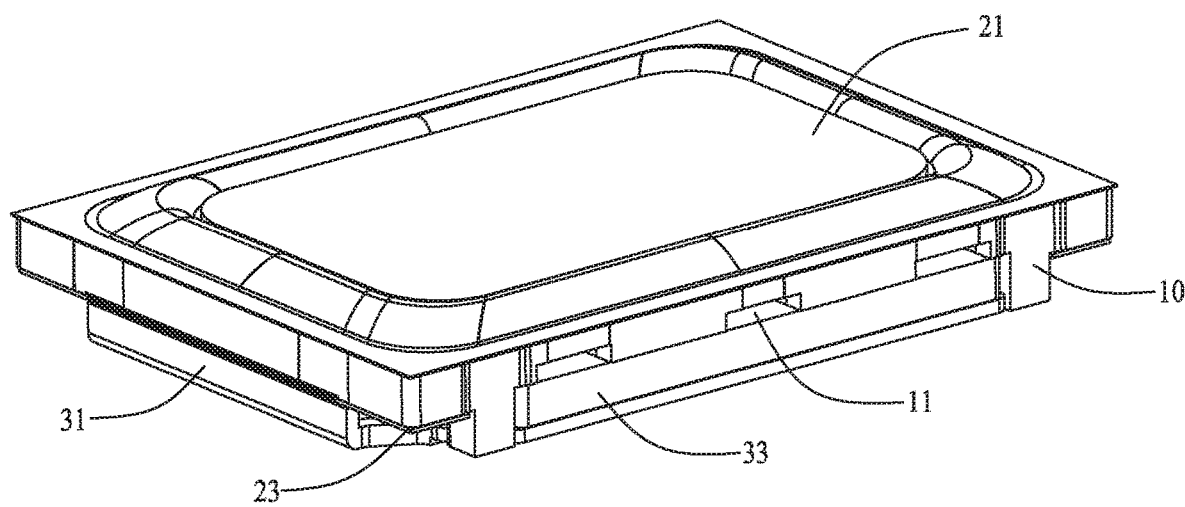
FIG. 4 is another schematic view of the loudspeaker of FIG. 1 shown from different angle.
Figure 5:
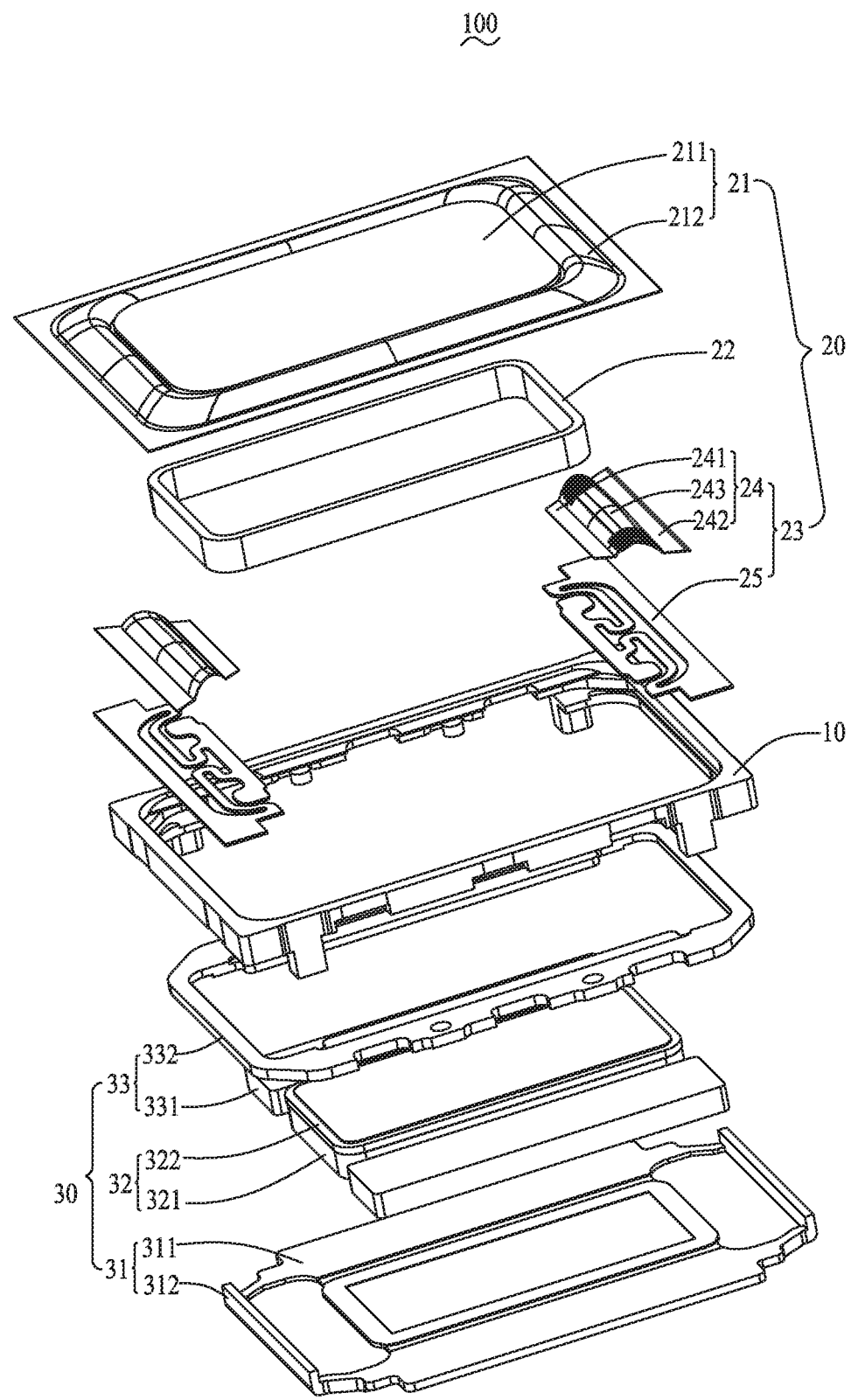
FIG. 5 is an exploded view of the loudspeaker of the present disclosure.
Figure 6:
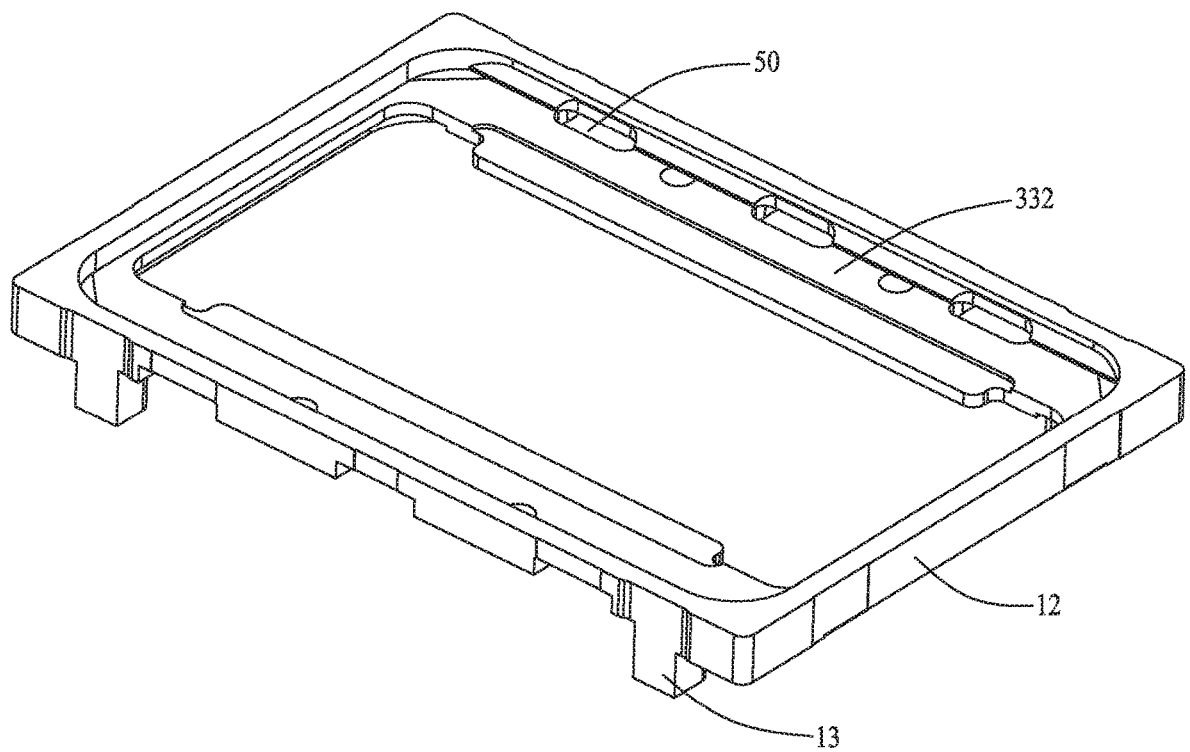
FIG. 6 is a schematic view of the assembly of the pole plate and the frame in FIG. 5.
Figure 7:
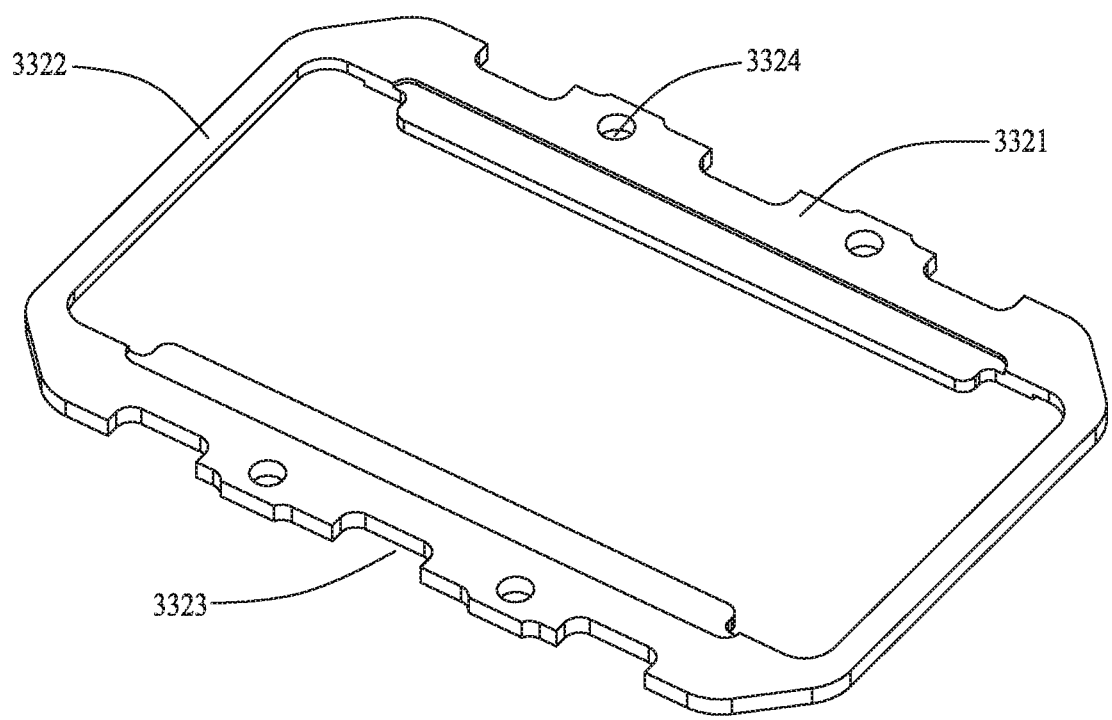
FIG. 7 is a schematic view of the pole plate in FIG. 6.
Figure 8:
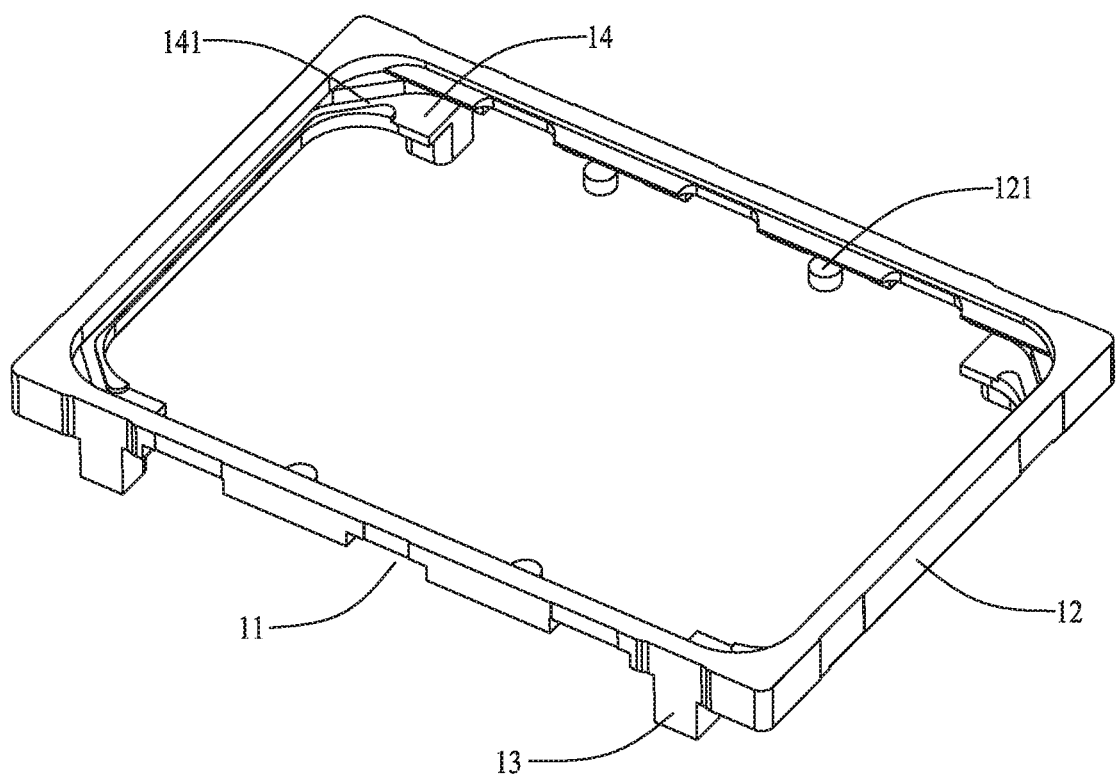
FIG. 8 is a schematic view of the frame in FIG. 6.

Referring to FIGS. 3 and 5, the lower diaphragm 24 includes a first edge portion 241 fixed to the voice coil 22, a second edge portion 242 spaced apart from the first edge portion 241, and a suspension 243 connected between the first edge portion 241 and the second edge portion 242. The yoke 31 includes a main body 311 for fixing the main magnet 321 and the side magnet 331, and a flange 312 extended from the main body 311 to the flexible circuit board 25. Two opposite sides of the first edge portion 241 are respectively fixedly connected with inner ends of the voice coil 22 and the flexible circuit board 25, two opposite sides of the second edge portion 242 are respectively fixedly connected with outer ends of the frame 10 and the flexible circuit board 25. A side of an outer end of the flexible circuit board 25 away from the membrane is fixedly connected with the flange 312, and the suspension 243 has an arc structure and is extended arcuately in a direction away from the flexible circuit board 25.

The present disclosure has the following advantage: the first pole plate 332 is provided with the through holes 3323 communicated with the spacing 40, and the frame 10 is provided with the through grooves 11 configured for communicating the through hole 3323 with the outside of the loudspeaker 100, when the membrane 21 vibrates downwards, the air in the spacing 40 can be discharged through the through holes 3323 and the through grooves 11, keeping the air flowing; when the membrane 21 vibrates upwards, the outside air may flow into the loudspeaker 100 through the through grooves 11 and the through hole 3323, so that the pressure inside the loudspeaker 100 is the same as the outside pressure, thus improving the quality of the loudspeaker 100.

The description above is only some embodiments of the present disclosure. It should be pointed out here that for those of ordinary skill in the art, improvements can be made without departing from the inventive concept of the present disclosure, which are all within the scope of the present disclosure.

What is claimed is:

1. A loudspeaker, comprising a frame, and a vibration system and a magnetic circuit system both mounted to the frame, the vibration system comprising a membrane fixed on the frame and a voice coil supported on a side of the membrane, the magnetic circuit system comprising a yoke fixed on a side of the frame away from the membrane, and a main magnet assembly and a side magnet assembly both fixed on a main body of the yoke, the yoke further includes a flange extended from the main body towards the membrane, the side magnet assembly being located at opposite sides of the main magnet assembly and spaced apart from the main magnet assembly to form a magnetic gap, and an end of the voice coil away from the membrane suspended in the magnetic gap, wherein, the side magnet assembly comprises a side magnet fixed to the yoke, and a first pole plate stacked on a side of the side magnet assembly away from the yoke, the first pole plate is spaced apart from the membrane to form a spacing communicated with the magnetic gap, the loudspeaker further comprises a leakage channel formed by a through hole arranged in the first pole plate together with a through groove arranged in the frame, the through hole is communicated with the spacing, and the through groove is configured to communicate the through hole with an outside of the loudspeaker.

2. The loudspeaker of claim 1, wherein the first pole plate comprises two opposite first side plates respectively corresponding to the side magnet and two second side plates respectively connected between two ends of the first side plates; the frame comprises an annular body and a support part extended from an end of the annular body away from the membrane to the voice coil and configured for supporting the first pole plate; the through hole is arranged in a side one of the two second side plates away from the voice coil; and the through groove is arranged in a portion of the annular body corresponding to the through hole.

3. The loudspeaker of claim 2, wherein the through hole is passed through one of the two second side plates along a vibration direction of the voice coil, and the through groove is passed through the annular body along a direction perpendicular to the vibration direction of the voice coil.

4. The loudspeaker of claim 3, wherein the vibration system further comprises a support member fixed on a side of the voice coil away from the membrane, one end of the support member is connected with the voice coil, and another end of the support member is fixed with the frame, and the support member and the side magnet are located on different sides of the frame.

5. The loudspeaker of claim 4, wherein the flange extended from the main body to the support member, and the support member comprises a flexible circuit board fixed with the flange and a lower diaphragm sandwiched between the flexible circuit board and the frame; the lower diaphragm comprises a first edge portion fixed with the voice coil, a second edge portion spaced from the first edge portion, and a suspension connected between the first edge portion and the second edge portion, the second edge portion is fixed with the frame, and the suspension has an arc-shaped structure extended arcuately away from the flexible circuit board.

6. The loudspeaker of claim 2, wherein one of the first side plates comprises a lug, the support part comprises a notch corresponding to the lug, and a shape of the notch is matched with that of the lug.

7. The loudspeaker of claim 6, wherein the vibration system further comprises a support member fixed on a side of the voice coil away from the membrane, one end of the support member is connected with the voice coil, and another end of the support member is fixed with the frame, and the support member and the side magnet are located on different sides of the frame.

8. The loudspeaker of claim 7, wherein the flange extended from the main body to the support member, and the support member comprises a flexible circuit board fixed with the flange and a lower diaphragm sandwiched between the flexible circuit board and the frame; the lower diaphragm comprises a first edge portion fixed with the voice coil, a second edge portion spaced from the first edge portion, and a suspension connected between the first edge portion and the second edge portion, the second edge portion is fixed with the frame, and the suspension has an arc-shaped structure extended arcuately away from the flexible circuit board.

9. The loudspeaker of claim 2, wherein each second side plate defines three through holes arranged at intervals.

10. The loudspeaker of claim 9, wherein the vibration system further comprises a support member fixed on a side of the voice coil away from the membrane, one end of the support member is connected with the voice coil, and another end of the support member is fixed with the frame, and the support member and the side magnet are located on different sides of the frame.

11. The loudspeaker of claim 10, wherein the flange extended from the main body to the support member, and the support member comprises a flexible circuit board fixed with the flange and a lower diaphragm sandwiched between the flexible circuit board and the frame; the lower diaphragm comprises a first edge portion fixed with the voice coil, a second edge portion spaced from the first edge portion, and a suspension connected between the first edge portion and the second edge portion, the second edge portion is fixed with the frame, and the suspension has an arc-shaped structure extended arcuately away from the flexible circuit board.

12. The loudspeaker of claim 2, wherein the vibration system further comprises a support member fixed on a side of the voice coil away from the membrane, one end of the support member is connected with the voice coil, and another end of the support member is fixed with the frame, and the support member and the side magnet are located on different sides of the frame.

13. The loudspeaker of claim 12, wherein the flange extended from the main body to the support member, and the support member comprises a flexible circuit board fixed with the flange and a lower diaphragm sandwiched between the flexible circuit board and the frame; the lower diaphragm comprises a first edge portion fixed with the voice coil, a second edge portion spaced from the first edge portion, and a suspension connected between the first edge portion and the second edge portion, the second edge portion is fixed with the frame, and the suspension has an arc-shaped structure extended arcuately away from the flexible circuit board.

14. The loudspeaker of claim 1, wherein the vibration system further comprises a support member fixed on a side of the voice coil away from the membrane, one end of the support member is connected with the voice coil, and another end of the support member is fixed with the frame, and the support member and the side magnet are located on different sides of the frame.

15. The loudspeaker of claim 14, wherein the flange extended from the main body to the support member, and the support member comprises a flexible circuit board fixed with the flange and a lower diaphragm sandwiched between the flexible circuit board and the frame; the lower diaphragm comprises a first edge portion fixed with the voice coil, a second edge portion spaced from the first edge portion, and a suspension connected between the first edge portion and the second edge portion, the second edge portion is fixed with the frame, and the suspension has an arc-shaped structure extended arcuately away from the flexible circuit board.

16. The loudspeaker of claim 1, wherein the first pole plate and the frame are integrated by injection molding, and the first pole plate defines an injection positioning hole.

17. The loudspeaker of claim 1, wherein the vibration system further comprises a support member fixed on a side of the voice coil away from the membrane, one end of the support member is connected with the voice coil, and another end of the support member is fixed with the frame, and the support member and the side magnet are located on different sides of the frame.

18. The loudspeaker of claim 17, wherein the flange extended from the main body to the support member, and the support member comprises a flexible circuit board fixed with the flange and a lower diaphragm sandwiched between the flexible circuit board and the frame; the lower diaphragm comprises a first edge portion fixed with the voice coil, a second edge portion spaced from the first edge portion, and a suspension connected between the first edge portion and the second edge portion, the second edge portion is fixed with the frame, and the suspension has an arc-shaped structure extended arcuately away from the flexible circuit board.

* * * * *